(12) United States Patent
Kaneda

(10) Patent No.: US 8,004,910 B2
(45) Date of Patent: Aug. 23, 2011

(54) DATA TRANSFER SYSTEM

(75) Inventor: Yoshinobu Kaneda, Ora-gun (JP)

(73) Assignees: SANYO Electric Co., Ltd., Moriguchi-shi (JP); SANYO Semiconductor Co., Ltd., Gunma (JP)

( * ) Notice: Subject to any disclaimer, the term of this patent is extended or adjusted under 35 U.S.C. 154(b) by 47 days.

(21) Appl. No.: 12/694,448

(22) Filed: Jan. 27, 2010

(65) Prior Publication Data

US 2010/0188924 A1    Jul. 29, 2010

(30) Foreign Application Priority Data

Jan. 28, 2009  (JP) .................................. 2009-016647

(51) Int. Cl.
*G11C 7/10* (2006.01)
(52) U.S. Cl. ............ 365/189.17; 365/189.2; 365/185.08; 365/185.09; 365/185.11; 365/51
(58) Field of Classification Search ............. 365/185.08, 365/185.09, 185.11, 51, 189.17, 189.2
See application file for complete search history.

(56) References Cited

U.S. PATENT DOCUMENTS 5,568,442 A * 10/1996 Kowalczyk et al. ..... 365/230.03
2007/0147144 A1 * 6/2007 Tokiwa ........................ 365/200

FOREIGN PATENT DOCUMENTS

| JP | 11-39222 | 2/1999 |
| JP | 11-175499 | 7/1999 |
| JP | 2001-325243 | 11/2001 |

* cited by examiner

*Primary Examiner* — Hoai V Ho
*Assistant Examiner* — Jay Radke
(74) *Attorney, Agent, or Firm* — Morrison & Foerster LLP

(57) ABSTRACT

The invention is directed to decreasing a circuit size of a system in which a plurality of devices or circuit blocks share and use one memory. A system is configured so that a memory block serves as a master and each of circuit blocks serves as a slave, and thus the slave side (the circuit blocks) receives necessary data from the memory block by only having decoders corresponding to addresses assigned thereto in advance and registers. In this case, since the registers have been also needed in a conventional system in order to hold data read out from a memory, the circuit size decreases in the whole system. Since this effect is enhanced in proportion to the number of the circuit blocks sharing the memory block, the effect is enhanced as the system size increases.

6 Claims, 4 Drawing Sheets

US 8,004,910 B2

DATA TRANSFER SYSTEM

CROSS-REFERENCE OF THE INVENTION

This application claims priority from Japanese Patent Application No. 2009-016647, the content of which is incorporated herein by reference in its entirety.

BACKGROUND OF THE INVENTION

1. Field of the Invention

The invention relates to a data transfer system, in particular, a system in which a plurality of devices or a plurality of circuit blocks share and use one memory.

2. Description of the Related Art

A system in which a plurality of devices or a plurality of circuit blocks share and use one memory has been known conventionally. In this kind of system, in general, a memory receives an access signal from devices or circuit blocks that serve as masters and outputs readout data. In this case, if each of the devices or each of the circuit blocks does not have a memory control circuit for reading out the data of the memory, each of these can not read out the data of the memory.

Furthermore, there is a case where a plurality of devices or circuit blocks simultaneously access one memory. For such a case of simultaneous accesses, it is necessary to mount an access control circuit on the memory side, which avoids access collision and controls the priorities of the data outputs from the memory and so on.

This kind of system in which devices or circuit blocks that need data in a memory serve as masters and the memory that holds the data serves as a slave is disclosed in Japanese Patent Application Publication Nos. Hei 11-039222, Hei 11-175499 and 2001-325243.

As described above, in a system in which a plurality of devices or a plurality of circuit blocks share and use one memory, each of the devices or circuit blocks needs to have a memory control circuit for reading out the data of the memory, thereby increasing the circuit size in the whole system. Furthermore, an access control circuit is mounted on the memory side, thereby further contributing to the increase of the circuit size.

This provides the system with complexity and large circuit size as a whole.

SUMMARY OF THE INVENTION

The invention provides a data transfer system that includes a plurality of system components and a memory shared and used by the system components. Each of the system components is a circuit block or a device. The memory includes a plurality of memory areas, and each of the memory areas holds data corresponding to a plurality of memory addresses. The memory also includes a memory control circuit outputting the addresses and the data held corresponding to the addresses in synchronization with a clock. Each of the system components includes a decoder decoding an address outputted by the memory control circuit so as to determine whether said memory address corresponds to one of the addresses that are assigned in advance to said each of the system components, and a register receiving the data outputted by the memory control circuit in synchronization with the clock depending on a result of the decoding by the decoder.

DETAILED DESCRIPTION OF THE INVENTION

First, the fundamental technical concept of the invention will be described. A system is configured so that devices or circuit blocks that need data held in a memory serve as slaves and the memory holding the data serves as a master. In other words, roles given to the devices, the circuit blocks and the memory are opposite from the conventional configuration.

In detail, the memory serves as a master and outputs address information and data corresponding to the address information held in the memory area sequentially in order of address numbers 00, 01, 02 and so on in synchronization with a clock generated from the memory without depending on an access from a specified device or circuit block the memory. Then, at the time when the address reaches the last number, the data output from the memory is stopped.

On the other hand, the devices or circuit blocks serving as slaves decode the address information outputted from the memory. Then, at the time when the device or circuit block judges that the address information corresponds to an address that is assigned to the device or circuit block in advance, the device or circuit block receives necessary data in synchronization with the clock outputted from the memory.

Figure 1:
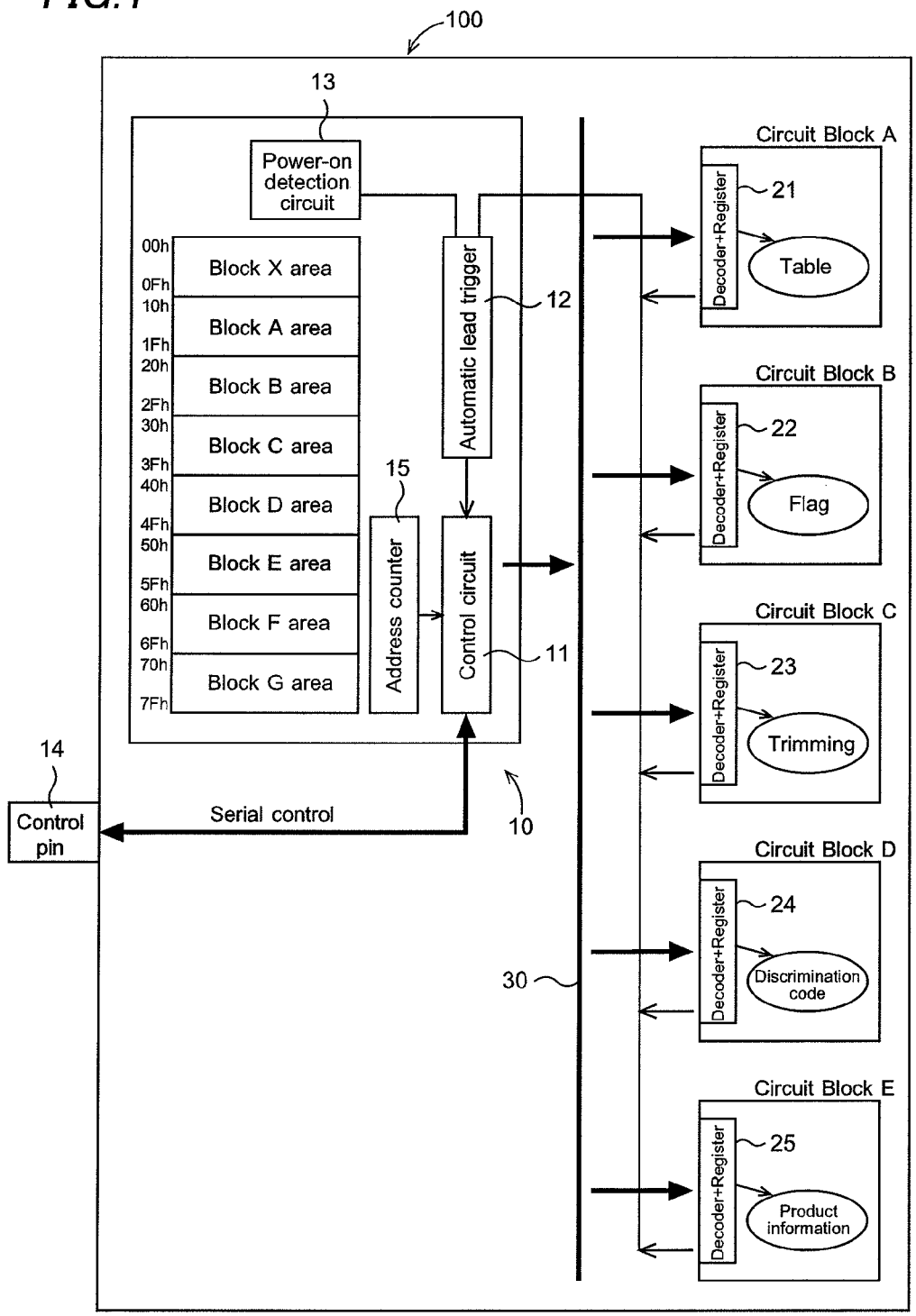
FIG. 1 is a diagram showing a structure of a data transfer system of an embodiment of the invention.

FIG. 1 is a diagram showing a structure of the data transfer system of an embodiment of the invention. This system is of a system-on-chip type in which a memory block 10 and circuit blocks A to E are formed on one semiconductor chip 100.

As shown by the address map in the figure, the memory block 10 has a memory area for holding data, and the memory area includes eight blocks, i.e., a block X area (addresses 00h to 0Fh), a block A area (addresses 10h to 1Fh), a block B area (addresses 20h to 2Fh), a block C area (addresses 30h to 3Fh), a block D area (addresses 40h to 4Fh), a block E area (addresses 50h to 5Fh), a block F area (addresses 60h to 6Fh) and a block G area (addresses 70h to 7Fh). The addresses XXh are represented by hexadecimal numbers.

The block A area corresponds to the circuit block A, and the block B area corresponds to the circuit block B. The other block areas respectively correspond to the circuit blocks likewise. However, the block X area does not correspond to a specific circuit block initially since this is an extension memory area for extending a memory capacity according to needs.

The block areas in the memory area are preferably configured of, for example, electrically erasable, writable, readable and rewritable nonvolatile memories such as a flash memory or EEPROM.

A control circuit 11 of the memory block 10 outputs a clock, addresses and data corresponding to the addresses to the circuit blocks A to E through a data bus 30. The addresses and data are outputted in synchronization with the clock.

Figure 2:
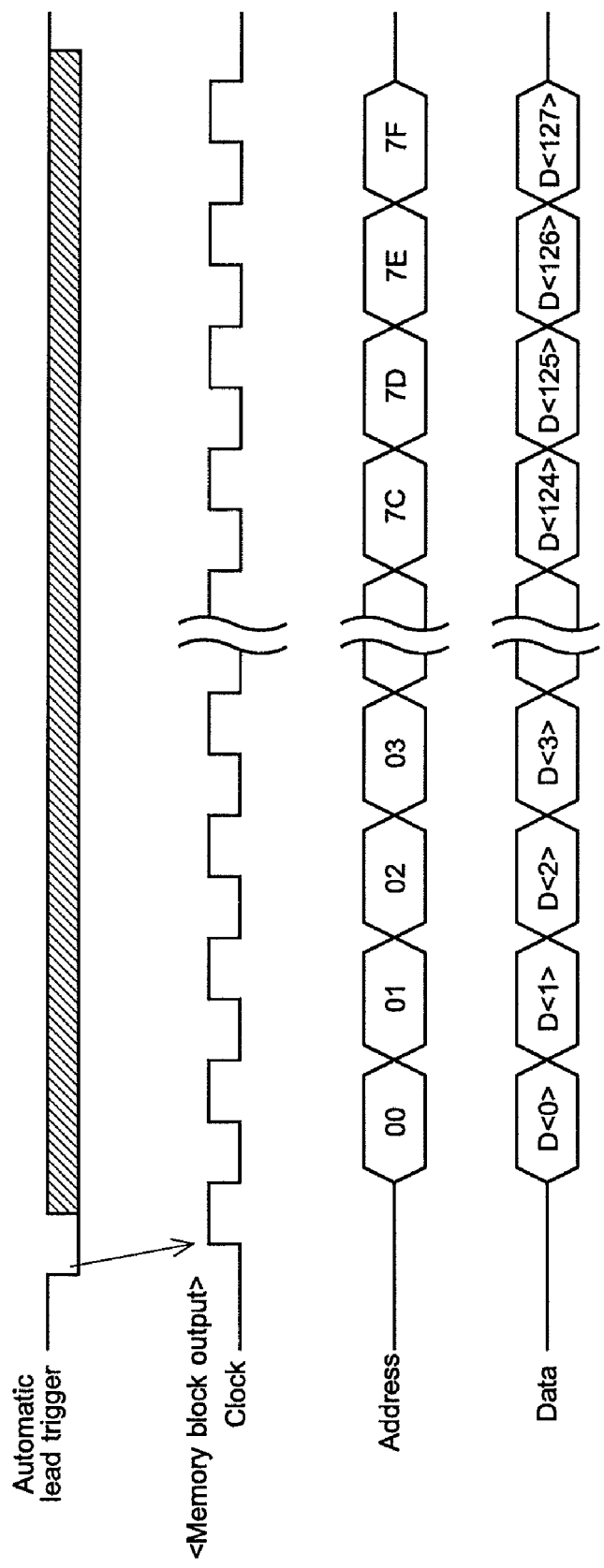
FIG. 2 is a timing chart of data output from a memory.

FIG. 2 shows an example of the data output of the control circuit 11. The memory block 10 starts operating in response to a trigger signal outputted from an automatic lead trigger circuit 12. In detail, as the trigger signal is outputted, a clock generation circuit mounted on the memory block 10 starts and outputs a constant frequency clock. It is preferable that the address number is increased, like 00, 01, 02, 03 and so on, in synchronization with the falls of the clock in time series.

Then, the data D<0>, D<1>, D<2>, D<3> and so on corresponding to the addresses are outputted in time series. An address counter 15 mounted on the memory block 10 is used in order to increase the address. As the address reaches the last number 7F and the last data D<127> is outputted, the control circuit 11 stops the data output operation.

In this case, the automatic lead trigger circuit 12 outputs the trigger signal in response to a power-on detection signal from a power-on detection circuit 13 that detects the power-on of the system. In detail, the control circuit 11 starts the data output sequence described above automatically as the system is powered on. By this, the circuit blocks A to E receive necessary data held in the memory block 10 automatically when the system is powered on. In this case, the memory block 10 needs to hold data even when the system is powered off and, thus, needs to include nonvolatile memories.

Furthermore, the automatic lead trigger circuit 12 is also configured so as to output the trigger signal as any one of the circuit blocks A to E outputs a trigger.

The control circuit 11 is configured so as to start the data output sequence described above as the data held in the memory area is rewritten, as well as in the case described above. Furthermore, this data output sequence may be performed automatically at a regular interval.

In detail, in response to a rewrite control signal for address, data and so on that is inputted from a control pin 14, the control circuit 11 rewrites the data of the corresponding address in the memory block 10. The memory block 10 needs to be configured of a rewritable memory in this case.

As described above, when the data in the memory area is rewritten, the control circuit 11 automatically starts and outputs a clock, addresses and data corresponding to the addresses to the circuit blocks A to E through the data bus 30. In this case, too, the circuit blocks A to E operate in the similar manner to the above. By this, the circuit blocks A to E receive updated latest data.

Furthermore, by mounting a timer on the memory block 10, the control circuit 11 regularly starts the data output sequence described above in response to the output of the timer by observing the output of the timer.

On the other hand, decoders and registers (which are shown as "Decoder+Register" 21 to 25 in FIG. 1) are mounted on the circuit blocks A to E, respectively. The decoder decodes the address information transferred from the control circuit 11 of the memory block 10, and when the address information corresponds to an address that is assigned to the circuit block in advance, the decoder outputs the data corresponding to that address to the register on the next stage. Then the register receives the data in synchronization with the clock and holds it.

The data received by the register is used as circuit control data or the like of that circuit block, for example, as logic control table data in the circuit block A, flag data in the circuit block B, circuit trimming data in the circuit block C, IC discrimination data in the circuit block D, and IC product information management data in the circuit block E.

Figure 3:
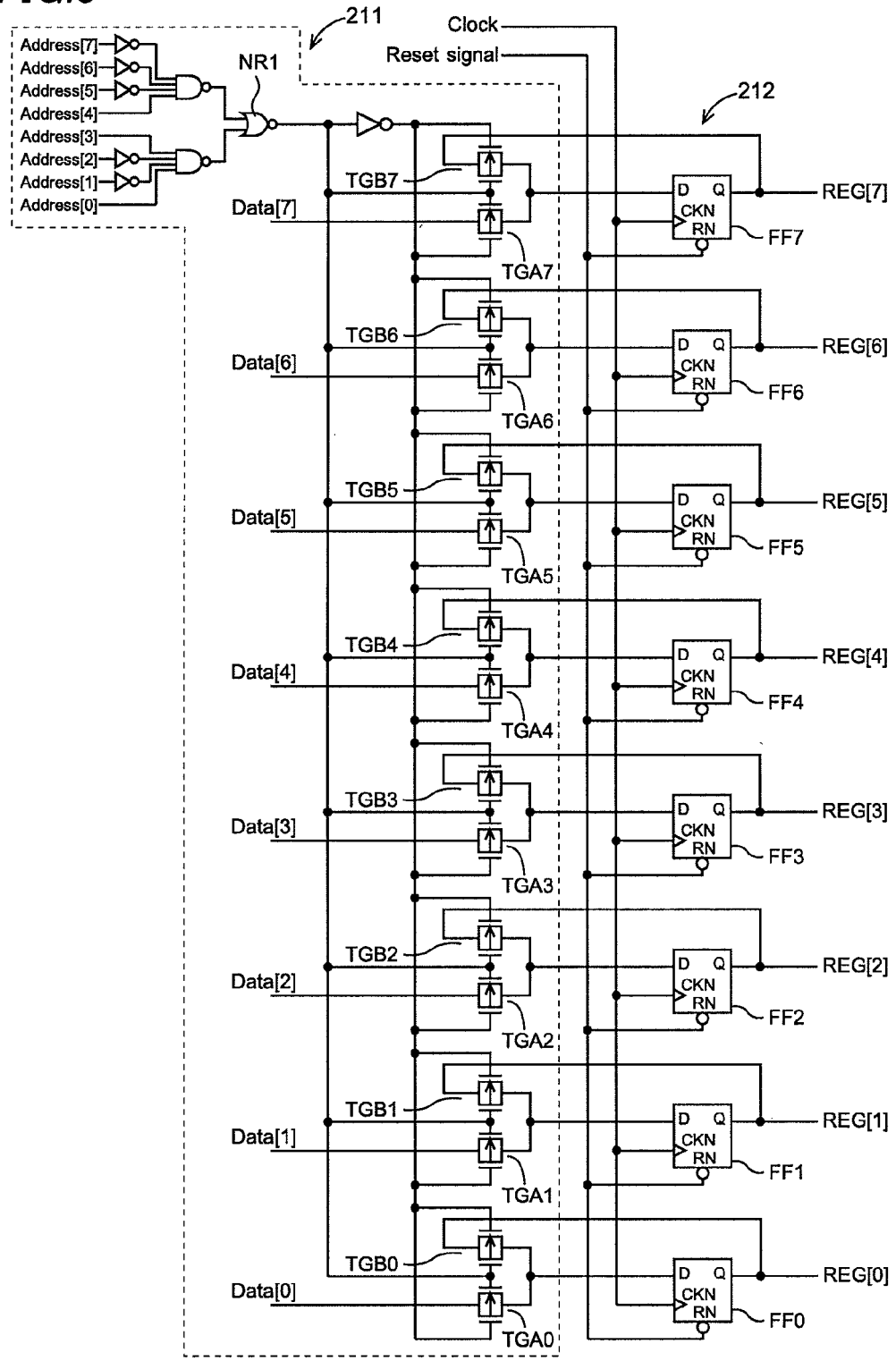
FIG. 3 is a circuit diagram of a decoder and a register.
Figure 4:
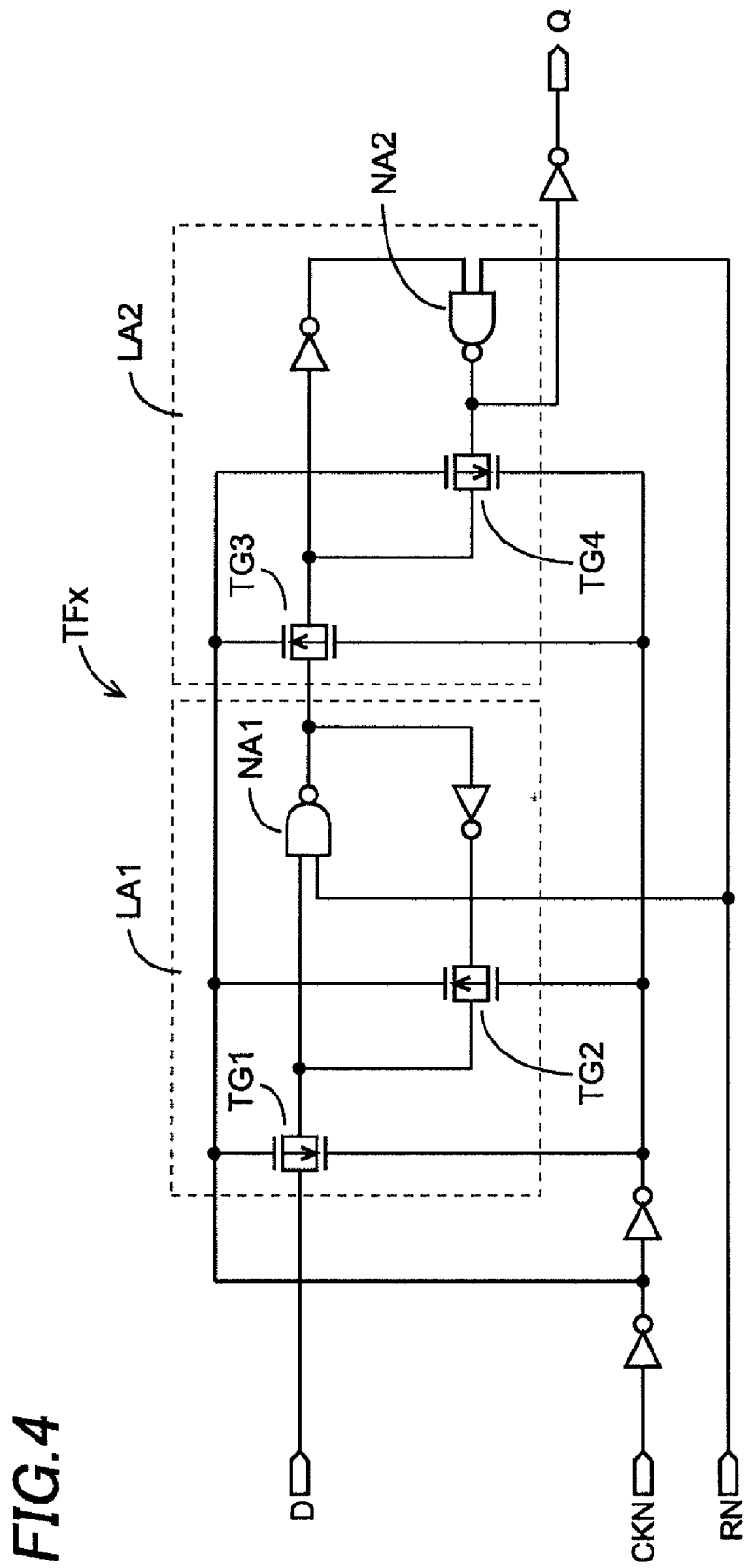
FIG. 4 is a detailed circuit diagram of the register.

FIG. 3 is a circuit diagram showing a structure of "Decoder+Register" mounted on each of the circuit blocks A to E. FIG. 4 is a detailed circuit diagram of the register.

Hereafter, a description will be given about a case where an address 19*h* is assigned to a decoder 211 in the circuit block A in advance. Data corresponding to one address 19*h* is of 8 bits.

In the decoder 211, the logic circuit of the decoder 211 is configured so that the output of a NOR circuit NR1 becomes H level when address information transferred from the control circuit 11 of the memory block 10 through the data bus 30 is 19*h*, i.e., when the bit data of the address data [0] to [7] are "10011000", and the output of the NOR circuit NR1 becomes L level when the other address is transferred.

Furthermore, the 8 bits of data [0] to [7] transferred from the control circuit 11 of the memory block 10 through the data bus 30 are inputted to CMOS transmission gates TGA0 to TGA7, respectively. The CMOS transmission gates TGA0 to TGA7 are configured so as to turn on when the output of the NOR circuit NR1 is H level.

When the CMOS transmission gates TGA0 to TGA7 turn on, the data [0] to [7] are applied to data input terminals D of flip-flops FF0 to FF7 forming a register 212 on the next stage through the CMOS transmission gates TGA0 to TGA7. Then, the data [0] to [7] are received by the corresponding flip-flops FF0 to FF7 in synchronization with the rise of the clock applied to clock input terminals CKN, and held therein.

When the output of the NOR circuit NR1 is L level, the CMOS transmission gates TGA0 to TGA7 are in the off state, but CMOS transmission gates TGB0 to TGB7 turn on and feed back the output data REG[0] to [7] of the flip-flops FF0 to FF7 to the data input terminals D and the data are inputted thereto. The flip-flops FF0 to FF7 are configured so as to be reset in response to a reset signal applied to reset terminals RN.

FIG. 4 is an example of a detailed circuit structure of the flip-flops FF0 to FF7. As shown in the figure, the flip-flop includes CMOS transmission gates TG1 to TG4, NAND circuits NA1, NA2, and an inverter, in which two latch circuits LA1, LA2 are connected in serial. When a reset signal of L level is inputted to the NAND circuits NA1, NA2, the output signal Q of the flip-flop becomes L level.

As described above, the system of the embodiment is configured so that the memory block 10 serves as a master and each of the circuit blocks A to E serves as a slave. Therefore, the slave side (the circuit blocks) receives necessary data from the memory block 10 by only having the decoders corresponding to the addresses that are respectively assigned thereto in advance and the registers.

The registers have been also needed in a conventional system in order to hold data read out from a memory, and thus the circuit size decreases in the whole system in this case. Since this effect is enhanced in proportion to the number of the circuit blocks sharing the memory block 10, the effect is enhanced as the system size increases.

Furthermore, an access control circuit for avoiding access collision is not necessary on the memory block 10 serving as a master. Furthermore, since a conventional address counter that has been built in a memory block in a conventional system is usable for the structure that realizes transferring data automatically from the memory block 10 to the circuit blocks A to E, the circuit size does not increase and the circuit size in the whole memory block 10 rather decreases.

Although the embodiment is described using a system of a system-on-chip type in which the memory block 10 and the circuit blocks A to E are formed on one semiconductor chip 100, as an example, the memory block 10 and the circuit blocks A to E may be formed on different semiconductor chips, respectively. Furthermore, instead of the circuit blocks A to E, a plurality of devices may be mounted.

Since the memory serves as a master and each of the devices or circuit blocks serves as a slave in the invention, the slave side (the devices or circuit blocks) receives necessary data from the memory by only having the decoders corresponding to addresses that are assigned thereto in advance and the registers.

In this case, since the registers have been also needed in a conventional system in order to hold data read out from a memory, the circuit size decreases in the whole system. Since this effect is enhanced in proportion to the number of the devices or circuit blocks sharing the memory, the effect is enhanced as the system size increases.

Furthermore, the memory serving as a master does not need an access control circuit for avoiding access collision. Furthermore, since a conventional address counter that has been built in a memory in a conventional system is usable for the structure that realizes transferring data from the memory to the devices or circuit blocks automatically, the circuit size does not increase and the circuit size in the whole memory rather decreases.

What is claimed is:

1. A data transfer system comprising:
a plurality of system components, each of the system components being a circuit block or a device; and
a memory shared and used by the system components,
wherein the memory comprises a plurality of memory areas, each of the memory areas holding data corresponding to a plurality of memory addresses, and a memory control circuit outputting the memory addresses and the data held corresponding to the memory addresses in synchronization with a clock,
each of the system components comprises a decoder decoding a memory address outputted by the memory control circuit so as to determine whether said memory address corresponds to one of the memory addresses that are assigned in advance to the system component, and a register receiving the data outputted by the memory control circuit in synchronization with the clock depending on a result of the decoding by the decoder, and
the memory control circuit starts the outputting of the memory addresses and the data in response to at least part of the data held in the memory areas being rewritten.

2. The data transfer system of claim 1, further comprising an automatic lead trigger circuit starting the outputting of the memory addresses and the data by the memory control circuit when the memory is powered on.

3. The data transfer system of claim 1, further comprising an automatic lead trigger circuit starting the outputting of the memory addresses and the data by the memory control circuit in response to a trigger signal from the circuit block.

4. The data transfer system of claim 1, wherein the memory control circuit starts the outputting of the memory addresses and the data at a regular interval.

5. The data transfer system of claim 1, wherein the memory control circuit comprises an address counter increasing a memory address in synchronization with the clock.

6. The data transfer system of claim 1, wherein the memory and the system components are formed on one semiconductor chip.

* * * * *